(12) United States Patent
Kurita et al.

(10) Patent No.: US 9,451,692 B2
(45) Date of Patent: Sep. 20, 2016

(54) PRINT ELEMENT SUBSTRATE, METHOD OF MANUFACTURING THE SAME, PRINTHEAD AND PRINTING APPARATUS

(71) Applicant: CANON KABUSHIKI KAISHA, Tokyo (JP)

(72) Inventors: Noriyuki Kurita, Oita (JP); Keiichi Sasaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/465,446

(22) Filed: Aug. 21, 2014

(65) Prior Publication Data

US 2015/0070434 A1 Mar. 12, 2015

(30) Foreign Application Priority Data

Sep. 6, 2013 (JP) .................................. 2013-185701

(51) Int. Cl.
*B41J 2/165* (2006.01)
*H05K 1/02* (2006.01)
*B41J 2/14* (2006.01)
*B41J 2/16* (2006.01)

(52) U.S. Cl.
CPC ......... *H05K 1/0272* (2013.01); *B41J 2/14072* (2013.01); *B41J 2/14129* (2013.01); *B41J 2/1603* (2013.01); *B41J 2/1628* (2013.01); *B41J 2/1629* (2013.01); *H05K 1/0212* (2013.01)

(58) Field of Classification Search
None
See application file for complete search history.

(56) References Cited

U.S. PATENT DOCUMENTS

| | | | |
|---|---|---|---|
| 6,228,712 B1 | 5/2001 | Kawai et al. | |
| 6,452,226 B2 | 9/2002 | Kawai et al. | |
| 6,838,351 B2 | 1/2005 | Sasaki et al. | |
| 7,244,370 B2 | 7/2007 | Sasaki et al. | |
| 7,270,398 B2 | 9/2007 | Sasaki et al. | |
| 7,287,838 B2 * | 10/2007 | Tsuchii | B41J 2/14129 347/63 |
| 2012/0047737 A1* | 3/2012 | Ishida et al. | 29/890.1 |

FOREIGN PATENT DOCUMENTS

| | | |
|---|---|---|
| JP | 2000-150678 A | 5/2000 |
| JP | 2002-134510 A | 5/2002 |
| JP | 2004-320002 A | 11/2004 |
| JP | 2005-085859 A | 3/2005 |

* cited by examiner

*Primary Examiner* — Alejandro Valencia
(74) *Attorney, Agent, or Firm* — Fitzpatrick, Cella, Harper & Scinto

(57) ABSTRACT

A method of manufacturing a print element substrate, comprising preparing a substrate, including a first region and a second region, in which a printing portion is formed on the first region, and a wiring pattern connected to the printing portion is formed on the first region and the second region, forming an insulating film covering the printing portion and the wiring pattern, and forming a conductive cavitation-resistant film on the insulating film, wherein in the forming the insulating film, the insulating film is formed such that a side surface of a portion of the insulating film, which is formed on the second region, includes an inclined face.

19 Claims, 6 Drawing Sheets

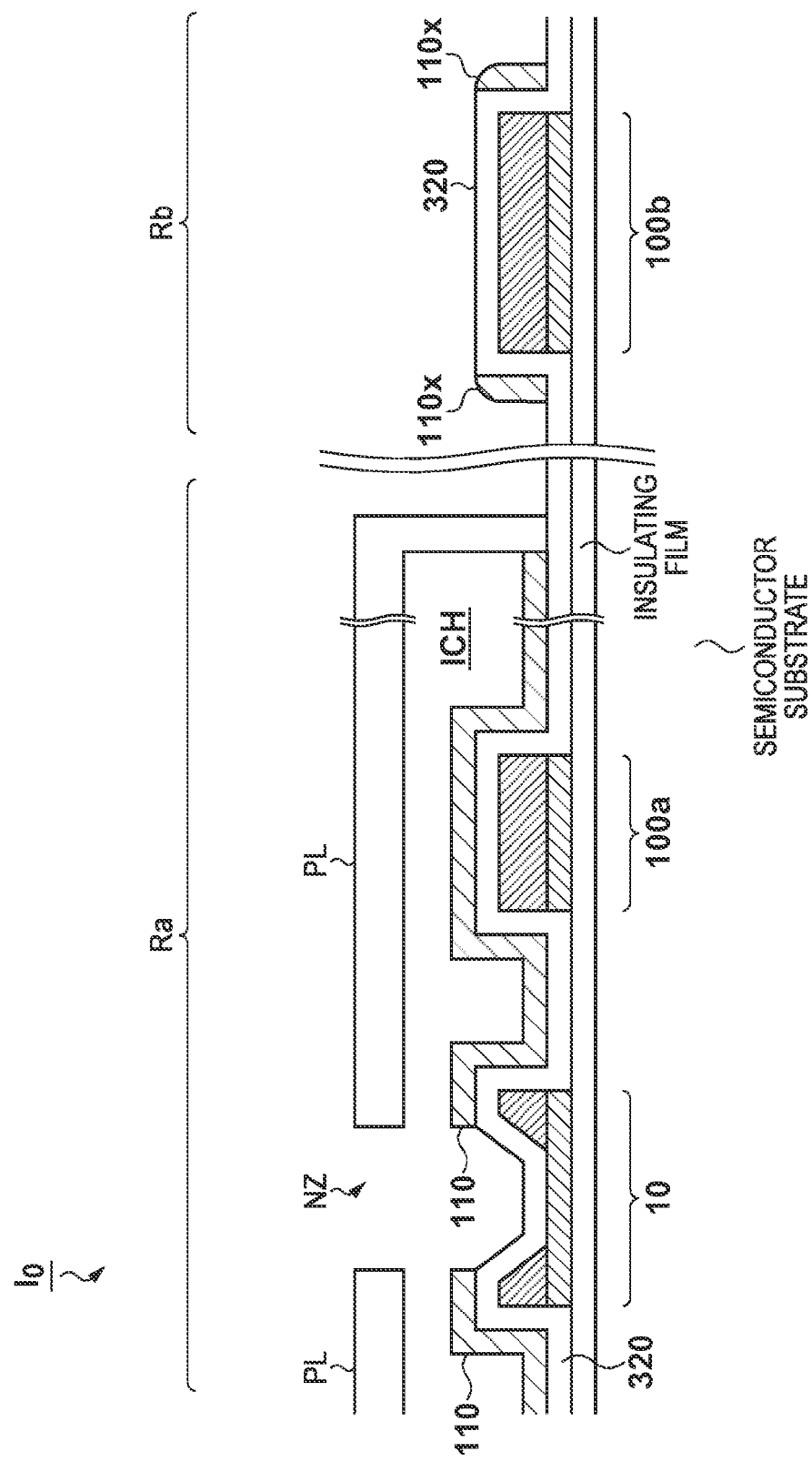

PRINT ELEMENT SUBSTRATE, METHOD OF MANUFACTURING THE SAME, PRINTHEAD AND PRINTING APPARATUS

BACKGROUND OF THE INVENTION

1. Field of the Invention

The present invention relates to a print element substrate, a method of manufacturing the same, a printhead, and a printing apparatus.

2. Description of the Related Art

An arrangement example of a print element substrate $I_0$ will be described with reference to FIG. 6. The print element substrate $I_0$ includes a printing portion 10, power wiring patterns 100 (100a and 100b) for supplying a power supply voltage to the printing portion 10, an insulating protective film 320 covering the printing portion 10 and power wiring patterns 100, and a cavitation-resistant film 110. In addition, an orifice plate PL forming a nozzle NZ for discharging ink and an ink channel ICH for supplying ink can be arranged on the print element substrate $I_0$.

A region Ra indicates a region where the ink channel ICH for supplying ink to the printing portion 10 is formed. A region Rb indicates a region which the ink in the ink channel ICH does not contact (for example, an electrode region where a bonding pad and the like are formed).

The cavitation-resistant film 110 is made of a conductive material having a high cavitation resistance such as tantalum (Ta). Thus, the cavitation-resistant film 110 protects the printing portion 10 and power wiring pattern 100a from cavitation caused by ink. The cavitation-resistant film 110 is formed in the region Ra by forming a conductive member such as Ta on the protective film 320, and etching a portion of the conductive member, which covers the region Rb.

When performing the above-described etching, a residue 110x of the conductive member may form in a step portion of the protective film 320 covering the power wiring pattern 100b. This residue may decrease the reliability of the print element substrate $I_0$, for example, may shortcircuit the wiring patterns. On the other hand, it is also possible to perform overetching so as not to form the residue 110x. However, this may damage the protective film, and may also damage the printing portion or wiring patterns.

In particular, it is necessary to decrease the spacings between the wiring patterns in order to reduce the chip area of the print element substrate. If the wiring pattern spacings are decreased, however, the above-described residue readily forms.

SUMMARY OF THE INVENTION

The present invention has been made based on the recognition of the above-mentioned problem by the present inventor, and advantageous in improving the reliability of a print element substrate while reducing the chip area of the print element substrate.

One of the aspects of the present invention provides a method of manufacturing a print element substrate, comprising steps of preparing a substrate including a first region, a second region different from the first region, a printing portion configured to print by supplying thermal energy to a liquid and formed on the first region, and a wiring pattern electrically connected to the printing portion and formed on the first region and on the second region; forming an insulating film covering the printing portion and the wiring pattern, the insulating film being formed on the first region and on the second region, and forming a conductive cavitation-resistant film on the insulating film by forming a conductive member on the insulating film, and removing at least a portion of the conductive member, the portion of the conductive member being formed on the second region, wherein in the step of forming the insulating film, the insulating film is formed such that a side surface of a portion of the insulating film, portion of the insulating film being formed on the second region, includes an inclined face.

Further features of the present invention will become apparent from the following description of exemplary embodiments with reference to the attached drawings.

BRIEF DESCRIPTION OF THE DRAWINGS

FIG. 6 is a view for explaining an arrangement example of a print element substrate.

DESCRIPTION OF THE EMBODIMENTS (Arrangement of Printing Apparatus)

An example of the arrangement of an inkjet printing apparatus will be described with reference to FIGS. 1A and 1B. The printing apparatus may be a single-function printer having only a printing function, or a multi-function printer having a plurality of functions such as a printing function, FAX function, and scanner function. Furthermore, the printing apparatus can include a manufacturing apparatus for manufacturing a color filter, electronic device, optical device, microstructure, or the like by a predetermined printing method. This manufacturing apparatus discharges a liquid as a material.

Figure 1A:
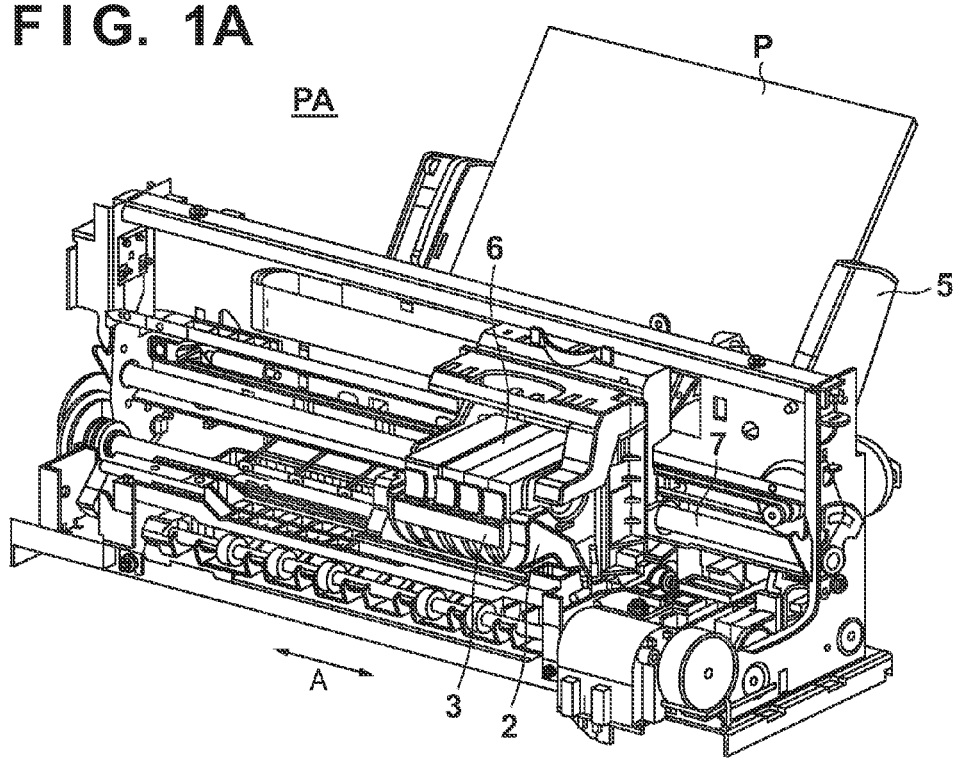
FIGS. 1A and 1B are views for explaining an arrangement example of a printing apparatus.

FIG. 1A is a perspective view showing an example of the outer appearance of a printing apparatus PA. In the printing apparatus PA, a printhead 3 for discharging ink to execute printing is mounted on a carriage 2, and the carriage 2 reciprocates in directions indicated by an arrow A to execute printing. The printing apparatus PA feeds a printing medium P such as printing paper via a sheet supply mechanism 5, and conveys it to a printing position. At the printing position, the printing apparatus PA executes printing by discharging ink from the printhead 3 onto the printing medium P.

In addition to the printhead 3, for example, ink cartridges 6 are mounted on the carriage 2. Each ink cartridge 6 stores ink to be supplied to the printhead 3. The ink cartridge 6 is detachable from the carriage 2. The printing apparatus PA is capable of executing color printing. Therefore, four ink cartridges which contain magenta (M), cyan (C), yellow (Y), and black (K) inks are mounted on the carriage 2. These four ink cartridges are independently detachable.

The printhead 3 includes a print element substrate on which print elements are arrayed. When using, for example, an inkjet method of discharging ink by using thermal energy, the print element is formed by using a thermoelectric converter (which may also be called a heater portion or simply a heater). The heater portion is formed for each ink discharge hole (nozzle), and a pulse voltage corresponding to a print signal is applied to the heater portion. The heater portion generates heat in response to the pulse voltage. Consequently, a bubble is formed in ink, and the ink is discharged from the nozzle corresponding to the heater portion.

Figure 1B:
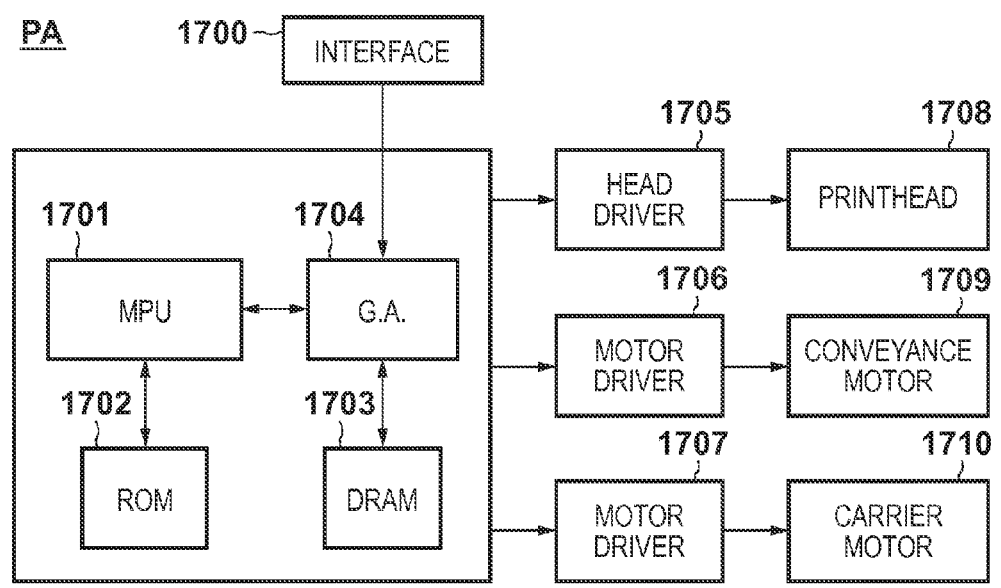

FIG. 1B exemplifies the system arrangement of the printing apparatus PA. The printing apparatus PA includes an interface 1700, an MPU 1701, a ROM 1702, a RAM 1703, and a gate array 1704. The interface 1700 receives a print signal. The ROM 1702 stores a control program to be executed by the MPU 1701. The RAM 1703 saves various data such as the aforementioned print signal, and print data supplied to a printhead 1708. The gate array 1704 controls supply of print data to the printhead 1708, and also controls data transfer between the interface 1700, the MPU 1701, and the RAM 1703.

The printing apparatus PA further includes a printhead driver 1705, motor drivers 1706 and 1707, a conveyance motor 1709, and a carrier motor 1710. The carrier motor 1710 carries the printhead 1708. The conveyance motor 1709 carries the printing medium. The printhead driver 1705 drives the printhead 1708. The motor drivers 1706 and 1707 drive the conveyance motor 1709 and carrier motor 1710, respectively.

When a print signal is input to the interface 1700, it can be converted into print data of a predetermined format between the gate array 1704 and the MPU 1701. Each mechanism performs a desired operation in accordance with the print data, thus performing the above-described printing.

(Arrangement Example of Print Element Substrate)

Figure 2:
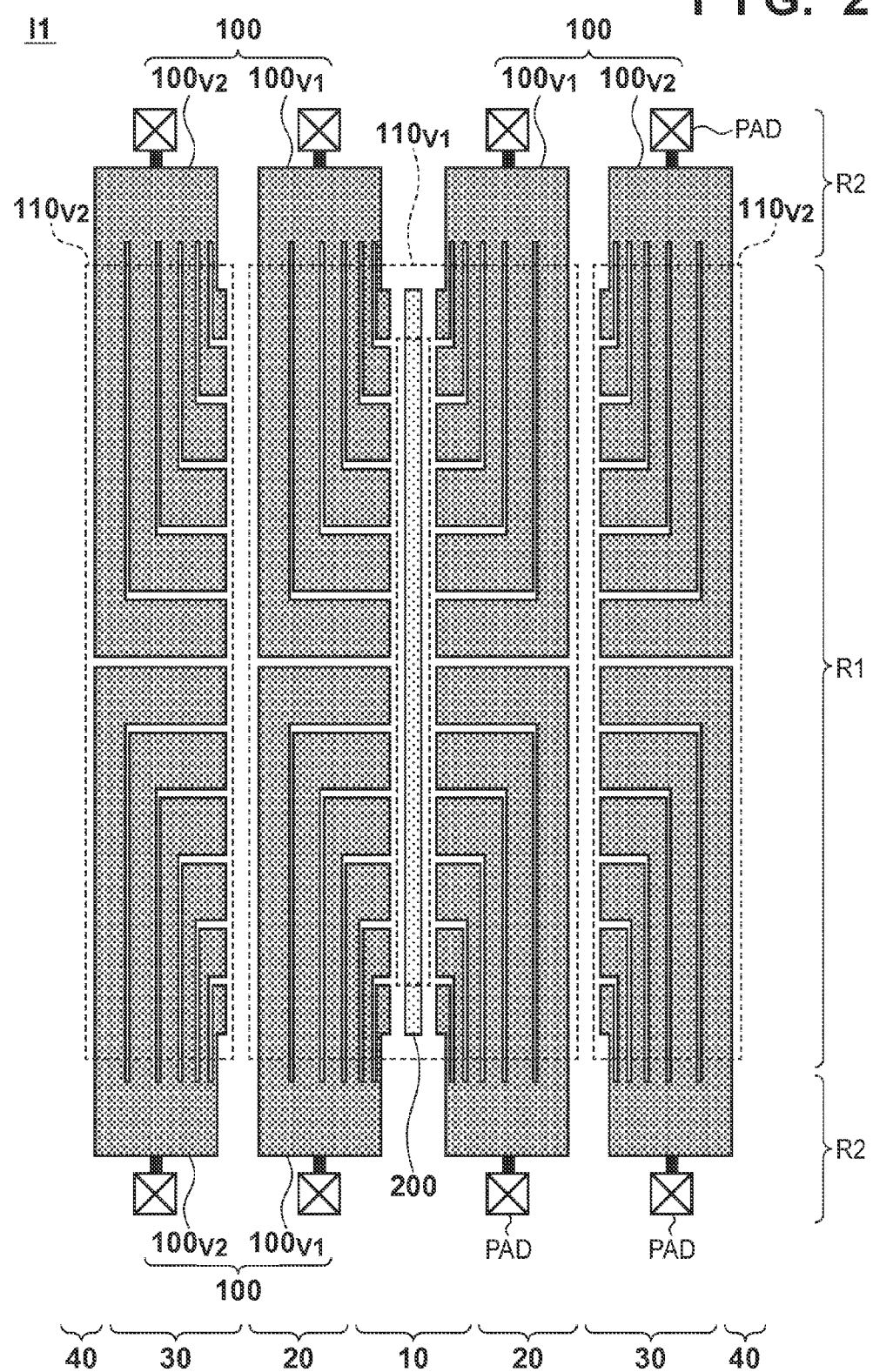
FIG. 2 is a view for explaining an arrangement example of a print element substrate.

FIG. 2 is a schematic view showing, as a plan view with respect to a print element substrate I1, a printing portion 10 for performing printing and power wiring patterns 100 (100$_{v1}$ and 100$_{v2}$) for supplying reference voltages (V1 and V2) to the printing portion 10 of the print element substrate I1. The print element substrate I1 is configured by forming the printing portion 10 and power wiring patterns 100 on an insulating film on a semiconductor substrate on which elements such as MOS transistors are formed.

The printing portion 10 includes a print element array 200 in which a plurality of print elements are arrayed. When adopting the inkjet printing method as described previously, for example, the printing portion 10 includes a heater portion, and a pair of electrodes for driving the heater portion. The plurality of print elements are divided into, for example, two or more groups, and can be driven by a so-called, time-division driving method. More specifically, the plurality of print elements can be driven group by group by using a control signal for selecting one of the two or more groups, and a control signal for selecting a print element to be driven in each group. The printing portion 10 may also include a circuit for driving the heater portion.

Also, driving portions 20 for driving the printing portion 10 can be formed to sandwich the printing portion 10. In addition, logic circuit portions 30 for processing print data can be formed to sandwich the printing portion 10 and driving portions 20. Furthermore, signal line portions 40 for transmitting control signals and signals based on print data can be formed outside the logic circuit portions 30.

FIG. 2 shows the patterns 100$_{v1}$ for supplying the power supply voltage V1 and the patterns 100$_{v2}$ for supplying the power supply voltage V2, as the power wiring patterns 100. The patterns 100$_{v1}$ and 100$_{v2}$ will be simply referred to as the power wiring patterns 100 hereinafter when it is unnecessary to distinguish between them. The power supply voltage V1 is, for example, a ground voltage. Note that the two types of power supply voltages are herein exemplified in order to simplify the explanation, but three or more types of power supply voltages may also be used.

A region R1 indicates a region where an ink channel (not shown) for supplying ink to the printing portion 10 is formed, and the printing portion 10 is formed in the region R1. Regions R2 indicate regions which the ink in the ink channel does not contact (for example, electrode regions where bonding pads PAD are formed). Note that as shown in FIG. 2, the power wiring patterns 100 are so patterned as to branch near the center of each region R2. The branched patterns are connected to the printing portion 10 so as to correspond to the individual groups for performing the above-described, time-division driving.

Also, a protective film (not shown) is formed on the printing portion 10 and power wiring patterns 100 so as to cover the printing portion 10 and power wiring patterns 100. This protective film is made of an insulating material such as silicon nitride ($Si_3N_4$). The protective film may also be formed to cover the whole of the regions R1 and R2. Note that this embodiment will be explained by exemplifying the "protective film" as a film covering the power wiring patterns 100, but the film need only be an insulating film and need not always have a protecting function.

Furthermore, on the above-described protective film on the printing portion 10 and power wiring patterns 100 in the region R1, a cavitation-resistant film 110 for protecting the printing portion 10 and power wiring patterns 100 from cavitation by the ink in the ink channel is formed. The cavitation-resistant film 110 is made of a conductive material having a high cavitation resistance such as tantalum (Ta). Also, the cavitation-resistance film 110 is electrically separated into a first portion 110$_{v1}$ covering the patterns 100$_{v1}$, and second portions 110$_{v2}$ covering the patterns 100$_{v2}$. This arrangement prevents corrosion of the power wiring patterns 100 and heater electrodes if a shortcircuit occurs between the power wiring patterns 100 and cavitation-resistant film 110 due to, for example, the application of an overvoltage. This is so because in a portion of the cavitation-resistant film 110, which is in contact with the ink in the ink channel, etching by the ink caused by an electric field may occur, and the power wiring patterns 100 and heater electrodes may corrode. In the following explanation, the first and second portions 110$_{v1}$ and 110$_{v2}$ will simply be called the cavitation-resistant film 110 when it is unnecessary to distinguish between them.

Figure 3:
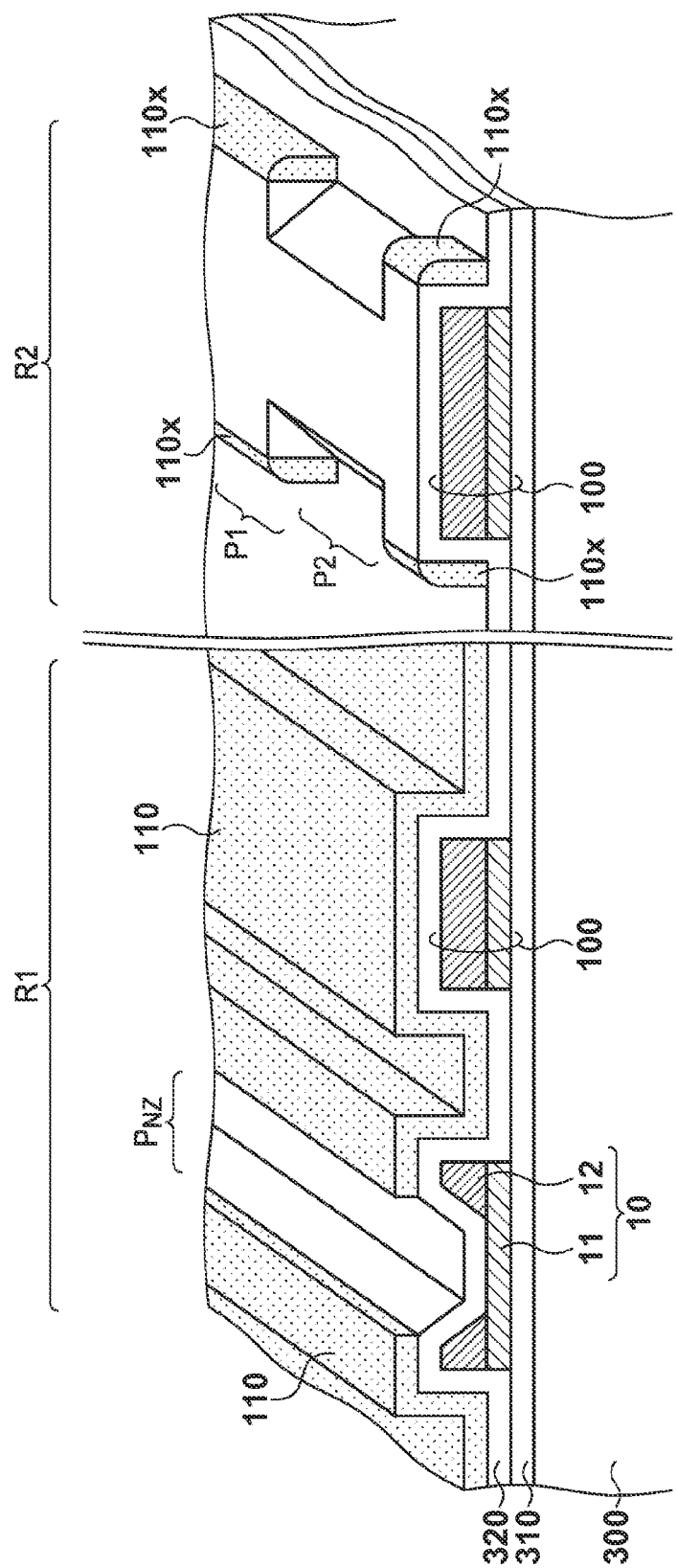
FIG. 3 is a view for explaining the arrangement example of the print element substrate.

FIG. 3 three-dimensionally exemplifies a schematic view of the arrangement of the print element substrate I1. The printing portion 10 and power wiring patterns 100 are formed on an insulating film 310 on a semiconductor substrate 300 on which elements such as MOS transistors are formed. The printing portion 10 includes a heater portion 11 (a thin metal film) for generating thermal energy when an electric current is supplied, and a pair of electrodes 12. The power wiring pattern 100 is formed by a metal member in the same layer as that of the heater portion 11, and a metal member in the same layer as that of the pair of electrodes 12. However, the arrangement of the power wiring pattern 100 is not limited to this. In addition, a protective film 320 is so formed as to cover the printing portion 10 and power wiring pattern 100.

Furthermore, in the region R1, the cavitation-resistant film 110 is so formed as to cover a part of the printing portion 10 and the power wiring patterns 100. The cavitation-resistant film 110 is formed by forming a conductive member such as Ta on the protective film 320, and partially removing the conductive member. This partial removal of the conductive member is performed by forming a mask pattern in the region R1, and etching the conductive member by using the mask pattern. In a portion $P_{NZ}$ of the printing portion 10, which is exposed by the cavitation-resistant film 110, thermal energy is given to the ink in the ink channel, the ink foams, and the ink is discharged from a nozzle (not shown).

In this structure, the side surfaces of the protective film 320 are partially inclined. "Inclined" herein mentioned is to form an angle larger than 0° and smaller than 90° with respect to the horizontal plane, and does not include "being vertical or horizontal". Also, an inclined angle is an angle formed between the inclined face and horizontal plane. Referring to FIG. 3, a portion P1 indicates a portion of the protective film 320, which has an almost vertical side surface, and a portion P2 indicates a portion having a side surface whose inclined angle is smaller than that of the portion P1. Residues 110x may form in the portion P1 but hardly form in the portion P2 because the thickness in the vertical direction of the conductive member formed on the portion P2 is smaller (thinner) than that of the conductive member formed on the portion P1. It is also possible to prevent the formation of the residues 110x in the portion P2. The protective film 320 need only be formed such that at least a portion of the side surface in the region R2 of the protective film 320 includes an inclined face. For example, it is possible to form the power wiring pattern 100 so that partial side surfaces in the region R2 of the power wiring pattern 100 include inclined faces, and form the protective film 320 covering the power wiring pattern 100 after that. In this formation method, the inclined faces of the protective film 320 are formed along the inclined faces of the power wiring pattern 100. Note that the "horizontal plane" is a plane parallel to the surface of a substrate, the surface of a gate insulating film of a MOS transistor formed on the substrate, or the interface between the gate insulating film and substrate.

The formation of the residues 110x can be prevented by inclining the side surfaces of a portion of the protective film 320, which covers the power wiring pattern 100. However, if the side surfaces of the entire protective film 320 are inclined, the sectional area decreases in the entire power wiring pattern 100, so the wiring resistance of the power wiring pattern 100 increases. On the other hand, when securing a sufficient sectional area of the power wiring pattern 100 while inclining the side surfaces of the whole protective film 320, the width of the entire power wiring pattern 100 increases more than necessary. In this structure, it is possible to selectively form a portion where no residue 110x exists by inclining the side surfaces of a portion of the protective film 320. Since the side surfaces of the entire protective film 320 are not inclined, therefore, it is possible to avoid the problem that the wiring resistance increases more than necessary because a sufficient sectional area of the power wiring pattern 100 cannot be secured. Accordingly, this structure is advantageous in improving the reliability of the print element substrate I1 in layout design.

(Example of Print Element Substrate Manufacturing Method)

Figure 4:
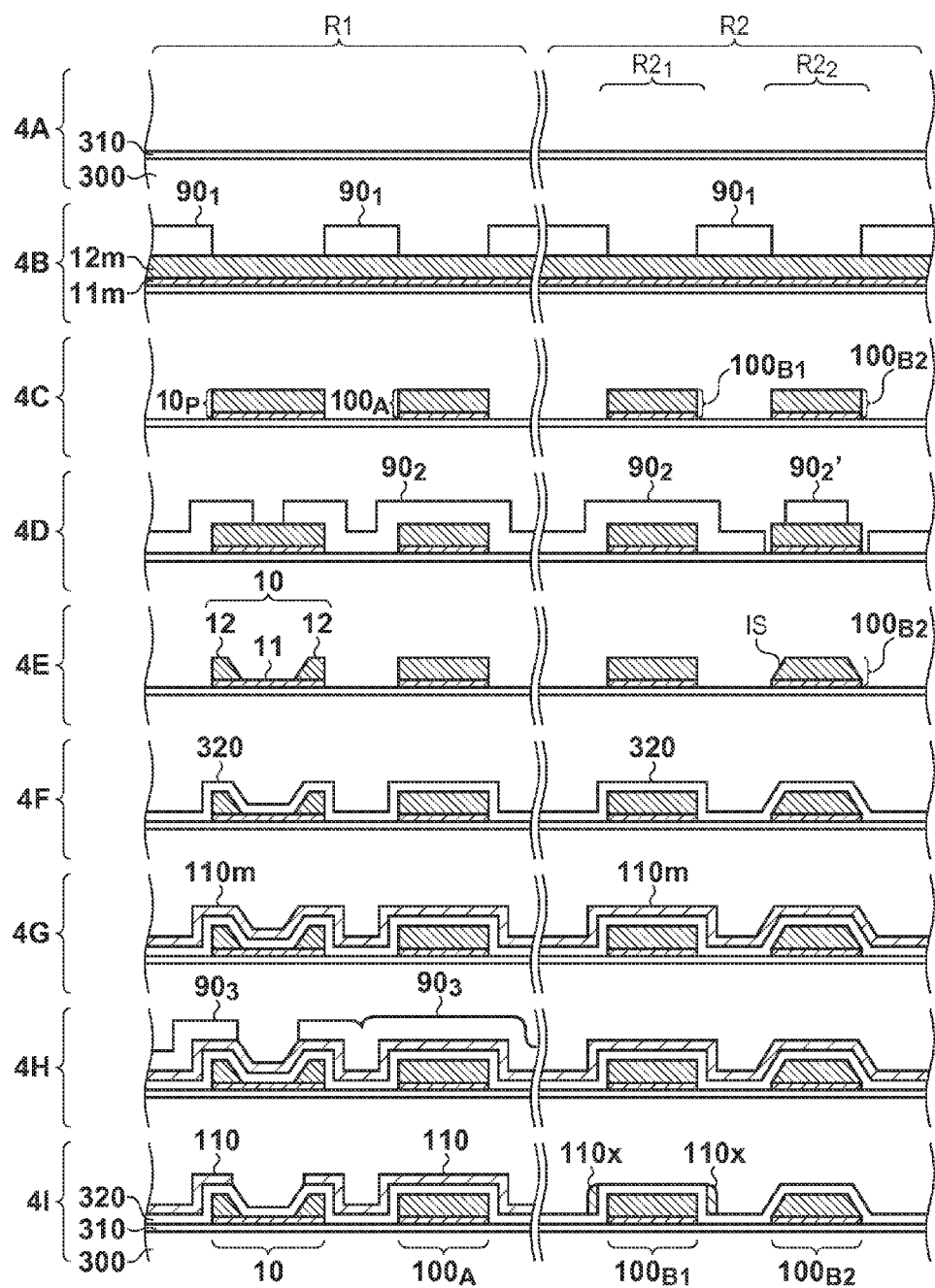
FIG. 4 is a view for explaining an example of a method of manufacturing the print element substrate.

An example of a method of manufacturing the print element substrate I1 will be explained below with reference to FIG. 4. (A) to (I) in FIG. 4 are schematic views showing steps of manufacturing the print element substrate I1. FIG. 4 mainly shows the printing portion 10 and power wiring patterns 100 in the regions R1 and R2. Note that in the region R2, a region $R2_1$ is a region where the above-described inclined faces are not formed later, and a region $R2_2$ is a region where the above-described inclined faces are formed later.

First, as exemplified in (A) of FIG. 4, a substrate 300 which is made of a semiconductor such as silicon and on which an element (not shown) such as a MOS transistor is formed is prepared, and an insulating film 310 is formed on the substrate 300.

Then, as exemplified in (B) and (C) of FIG. 4, a metal member $10_P$ for forming a printing portion 10 later and power wiring patterns 100 are formed by patterning on the insulating film 310. More specifically, as exemplified in (B) of FIG. 4, a metal film 11m for forming a heater portion 11 and a metal film 12m for forming a pair of electrodes 12 are first formed on the insulating film 310, and the formed metal film 12m is partially removed. Then, mask patterns $90_1$ for patterning the metal films 11m and 12m are formed.

After that, as exemplified in (C) of FIG. 4, patterning is performed by using the mask patterns $90_1$, thereby forming the metal member $10_P$ for forming a printing portion 10 later and the power wiring patterns 100. This patterning can be performed by anisotropic etching such as RIE (Reactive Ion Etching). When patterning is performed by anisotropic etching, the side surfaces of the power wiring patterns 100 are almost vertical. The wiring patterns 100 may also be patterned by another method and have inclined side surfaces. Note that in order to simplify the explanation, the power wiring patterns 100 will be referred to as power wiring patterns $100_A$, $100_{B1}$, and $100_{B2}$ for the regions R1, $R2_1$, and $R2_2$, respectively.

Subsequently, as exemplified in (D) of FIG. 4, a mask pattern $90_2$ having an opening in a portion of the printing portion 10 in the region R1 and an opening in a portion of the region $R2_2$ is formed. The mask pattern $90_2$ includes, on the power wiring pattern $100_{B2}$, a portion (mask pattern $90_2'$) having a width smaller than that of the power wiring pattern $100_{B2}$.

Then, as exemplified in (E) of FIG. 4, isotropic etching such as wet etching is performed by using the mask pattern $90_2$. In this step, a pair of electrodes 12 are formed. The pair of electrodes 12 are connected to the two ends of the printing portion 10; one electrode is connected to a power node, and the other electrode serves as an electrode portion to be connected to a switch for driving the printing portion 10. Also, in this step, a portion (the power wiring pattern $100_{B2}$) of the power wiring patterns 100 is processed, that is, inclined faces IS are formed by inclining the side surfaces of the power wiring pattern $100_{B2}$. The side surfaces of the power wiring patterns $100_A$ and $100_{B1}$ whose side surfaces and upper surfaces are covered with the mask pattern $90_2$ are maintained in the patterned state. In this example, the side surfaces are almost vertical. By thus performing patterning using the mask patterns $90_1$ and metal film removal using the mask pattern $90_2$, it is possible to form power wiring patterns including two portions having different inclined angles on the side surfaces.

Note that in this step, isotropic etching is performed in the region $R2_2$ by using the mask pattern $90_2'$ formed on the power wiring pattern $100_{B2}$ and having a width smaller than that of the power wiring pattern $100_{B2}$, thereby inclining the side surfaces of the power wiring pattern $100_{B2}$. However, a method of forming the inclined faces IS on the power wiring pattern $100_{B2}$ is not limited to this. For example, etching may also be performed by gradually removing the mask pattern $90_2'$ so as to decrease the width of the mask pattern $90_2'$ while the etching is performed. Furthermore, isotropic etching may also be performed by forming the mask pattern $90_2$ so as to expose only upper portions of the side surfaces of the power wiring pattern $100_{B2}$.

After that, as exemplified in (F) of FIG. 4, a protective film 320 such as silicon nitride is formed to cover the entire surfaces of the regions R1 and R2. The protective film 320 need only be an insulating film as described previously, and may or may not have a protecting function.

Then, as exemplified in (G) of FIG. 4, a conductive member 110m having a high cavitation resistance such as tantalum (Ta) is formed. The conductive member 110m is formed at least on the inclined faces IS of the power wiring pattern $100_{B2}$. The conductive member 110m may also be formed on the entire substrate surface.

After that, as exemplified in (H) of FIG. 4, a mask pattern $90_3$ having an opening in a portion above the printing portion 10 in the region R1 and an opening in the region R2 is formed.

Finally, as exemplified in (I) of FIG. 4, the conductive member 110m is etched by using the mask pattern $90_3$, thereby forming a cavitation-resistant film 110. In this step, as described previously, residues 110x of the conductive member 110m form on the side surfaces of a portion of the protective film 320, which is positioned above the power wiring pattern $100_{B1}$. However, no residue 110x forms on the inclined faces of a portion of the protective film 320, which is positioned above the power wiring pattern $100_{B2}$.

Figure 5A:
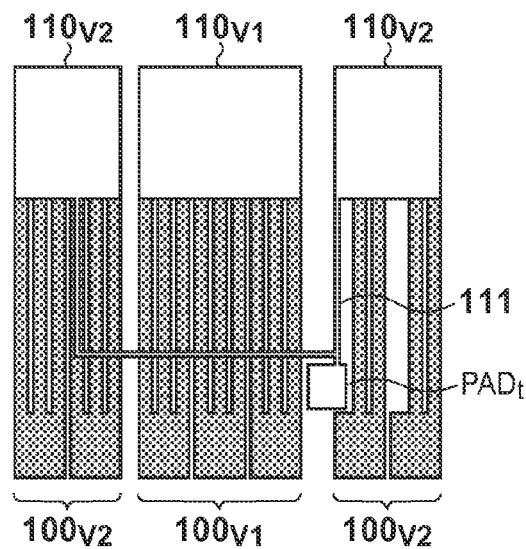
FIGS. 5A to 5C are views for explaining arrangement examples of the print element substrate.
Figure 5B:
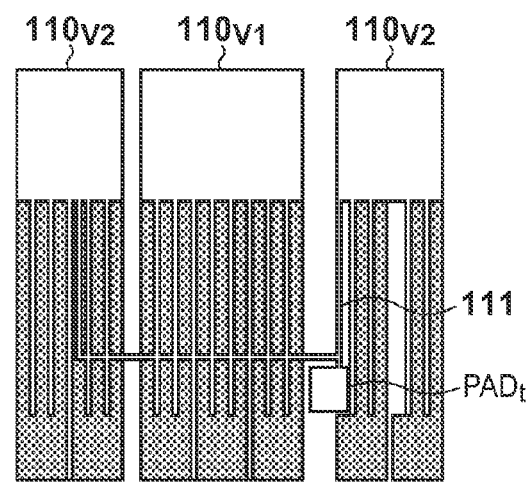
Figure 5C:
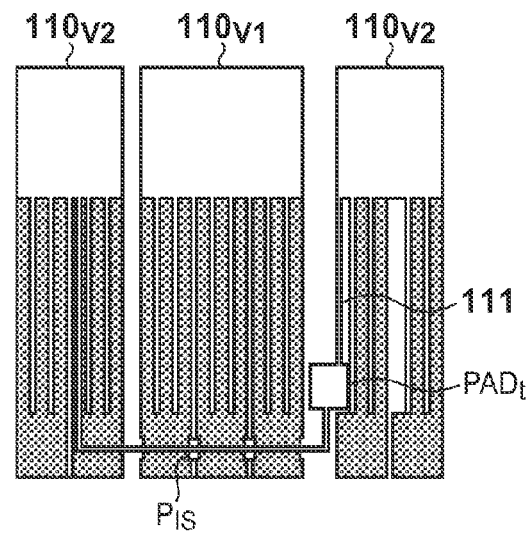

FIGS. 5A to 5C are enlarged views of the boundary between the regions R1 and R2 in the arrangement exemplified in FIG. 2. The two patterns $100_{v2}$ are arranged to sandwich the pattern $100_{v1}$. As described earlier, of the cavitation-resistant film 110, the first portion $110_{v1}$ covering the pattern $100_{v1}$ and the second portions $110_{v2}$ covering the patterns $100_{v2}$ are electrically isolated. In this arrangement, the second portion $110_{v2}$ covering one of the two patterns $100_{v2}$ and the second portion $110_{v2}$ covering the other are electrically connected to each other by a line pattern 111 made of the same material as that of the cavitation-resistant film. Also, as shown in FIGS. 5A to 5C, a test pad PADt connected to the line pattern 111 is formed. By bringing a probe into contact with the test pad PADt, therefore, it is possible to confirm that the first and second portions $110_{v1}$ and $110_{v2}$ are not electrically shortcircuited.

As a reference example, FIG. 5A shows an arrangement in which the above-mentioned line pattern 111 is formed to intersect the branched patterns $100_{v1}$ and $100_{v2}$ (to extend across the branched patterns $100_{v1}$ and $100_{v2}$). As described above, however, as shown in FIG. 5B, the residues 110x of the above-described conductive material may exist on the side surfaces of the protective film 320 covering the branched patterns $100_{v1}$ and $100_{v2}$. In this arrangement shown in FIG. 5B, therefore, the line pattern 111 may electrically be connected to the residues 110x.

As shown in FIG. 5C, therefore, inclined portions $P_{IS}$ are formed by inclining the side surfaces of the protective film 320 as described above, and the line pattern 111 is formed to extend over the inclined portions $P_{IS}$. Since no residue 110x forms on the inclined portions $P_{IS}$, it is possible to prevent the residue 110x and line pattern 111 from being electrically connected. The inclined portions $P_{IS}$ are preferably formed in an unbranched portion (that is, a wide portion of the pattern $100_{v1}$) of the power wiring patterns 100. This makes it possible to prevent an increase in wiring resistance, which is caused when no sufficient sectional area of the power wiring pattern 100 can be ensured. In addition, this obviates the need to enlarge the line-and-space more than necessary in order to secure a sufficient sectional area.

In the present invention as described above, it is possible to selectively form a portion where no residue 110x exists by inclining the side surfaces of a portion of the protective film 320. Since the side surfaces of the whole protective film 320 need not be inclined, therefore, it is possible to avoid the problem that the wiring resistance increases more than necessary because no sufficient sectional area of the power wiring pattern 100 can be secured. In particular, it is only necessary to selectively form this inclination in a portion of the residue 110x, which may exert influence on the reliability of the print element substrate I1. Accordingly, the present invention is advantageous in improving the reliability of the print element substrate.

Also, this inclination need only be selectively formed on the side surfaces of a wide portion of the power wiring pattern 100. This makes it possible to prevent an increase in wiring resistance, which is caused when no sufficient sectional area can be secured, and obviates the need to enlarge the line-and-space more than necessary in order to ensure a sufficient sectional area. Furthermore, the power wiring pattern 100 has been explained above as an example of a wiring pattern. However, the wiring pattern is not limited to this arrangement, and need only be a predetermined metal pattern electrically connected to the printing portion 10.

The present invention is not limited to the above-described structure and embodiment, and can be changed as needed in accordance with the purpose, state, application, function, and other specifications. Therefore, it is, of course, possible to carry out the present invention by another embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-185701, filed Sep. 6, 2013, which is hereby incorporated by reference herein in its entirety.

What is claimed is:

1. A print element substrate comprising:
a substrate including a first region and a second region;
a printing portion formed on the first region and configured to print by supplying thermal energy to a liquid;
a first wiring pattern including:
   a first portion formed on the first region, the first portion being in contact with the printing portion and having a first side surface that is inclined against a perpendicular line, which is a line perpendicular to an upper surface of the substrate,
   a second portion formed on the second region where the printing portion is not provided, the second portion having a second side surface that is inclined against the perpendicular line, and
   a third portion formed on the second region, the third portion having a third side surface, wherein an angle between the third side surface and the perpendicular line is smaller than an angle between
   the second side surface of the second portion and the perpendicular line;
an insulating film formed on the first region and on the second region, the insulating film covering the printing portion and the first, second, and third portions of the first wiring pattern;
a cavitation-resistant film formed on the insulating film in the first region and including a conductive material; and a second wiring pattern electrically isolated from at least part of the cavitation-resistant film,
wherein the insulating film includes:
a first insulating portion covering the second portion and having a side surface inclined correspondingly to the second side surface of the second portion, and
a second insulating portion covering the third portion and having a side surface corresponding to the third side surface of the third portion,
wherein an angle between the side surface of the first insulating portion and the perpendicular line is different from an angle between the side surface of the second insulating portion and the perpendicular line, and
wherein the second wiring pattern is provided on the first insulating portion and extends across the second portion of the first wiring pattern.

2. A printhead comprising:
a print element substrate; and
a nozzle configured to discharge a liquid,
wherein the print element substrate comprises:
a substrate including a first region and a second region;
a printing portion formed on the first region and configured to print by supplying thermal energy to the liquid;
a first wiring pattern including:
a first portion formed on the first region, the first portion being in contact with the printing portion and having a first side surface that is inclined against a perpendicular line, which is a line perpendicular to an upper surface of the substrate,
a second portion formed on the second region where the printing portion is not provided, the second portion having a second side surface that is inclined against the perpendicular line, and
a third portion formed on the second region, the third portion having a third side surface, wherein an angle between the third side surface and the perpendicular line is smaller than an angle between the second side surface of the second portion and the perpendicular line;
an insulating film formed on the first region and on the second region, the insulating film covering the printing portion and the first, second, and third portions of the first wiring pattern;
a cavitation-resistant film formed on the insulating film in the first region and including a conductive material; and
a second wiring pattern electrically isolated from at least part of the cavitation-resistant film,
wherein the insulating film includes:
a first insulating portion covering the second portion and having a side surface inclined correspondingly to the second side surface of the second portion, and
a second insulating portion covering the third portion and having a side surface corresponding to the third side surface of the third portion,
wherein an angle between the side surface of the first insulating portion and the perpendicular line is different from an angle between the side surface of the second insulating portion and the perpendicular line, and
wherein the second wiring pattern is provided on the first insulating portion and extends across the second portion of the first wiring pattern.

3. A printing apparatus comprising:
a printhead including a print element substrate and a nozzle configured to discharge a liquid; and
a printhead driver configured to drive the printhead,
wherein the print element substrate comprises:
a substrate including a first region and a second region;
a printing portion formed on the first region and configured to print by supplying thermal energy to the liquid;
a first wiring pattern including:
a first portion formed on the first region, the first portion being in contact with the printing portion and having a first side surface that is inclined against a perpendicular line, which is a line perpendicular to an upper surface of the substrate,
a second portion formed on the second region where the printing portion is not provided, the second portion having a second side surface that is inclined against the perpendicular line, and
a third portion formed on the second region, the third portion having a third side surface, wherein an angle between the third side surface and the perpendicular line is smaller than an angle between the second side surface of the second portion and the perpendicular line;
an insulating film formed on the first region and on the second region, the insulating film covering the printing portion and the first, second, and third portions of the first wiring pattern;
a cavitation-resistant film formed on the insulating film in the first region and including a conductive material; and
a second wiring pattern electrically isolated from at least part of the cavitation-resistant film,
wherein the insulating film includes:
a first insulating portion covering the second portion and having a side surface inclined correspondingly to the second side surface of the second portion, and
a second insulating portion covering the third portion and having a side surface corresponding to the third side surface of the third portion,
wherein an angle between the side surface of the first insulating portion and the perpendicular line is different from an angle between the side surface of the second insulating portion and the perpendicular line, and
wherein the second wiring pattern is provided on the first insulating portion and extends across the second portion of the first wiring pattern.

4. The print element substrate according to claim 1, wherein the second portion and the third portion are connected to each other in a first direction, and
wherein the second wiring pattern extends in a second direction intersecting with the first direction.

5. The print element substrate according to claim 4, wherein the second wiring pattern is connected to an electrode pad.

6. The print element substrate according to claim 5, wherein the electrode pad is not wire-bonded.

7. The print element substrate according to claim 1, wherein a member made of the same material as that of the cavitation-resistant film exists on the side surface of the second insulating portion.

8. The print element substrate according to claim 1, wherein:
the printing portion includes a first metal film,
the first portion of the first wiring pattern includes a second metal film formed on the first metal film so as to expose part of an upper surface of the first metal film,
the second portion of the first wiring pattern includes a third metal film and a fourth metal film formed thereon, where the third metal film is made of the same material as that of the first metal film and the fourth metal film is made of the same material as that of the second metal film, and part of the second side surface of the second portion is formed by the fourth metal film.

9. The print element substrate according to claim 1, wherein the second region is a region above which the liquid is not supplied.

10. The print element substrate according to claim 1, further comprising an orifice plate that forms a channel for supplying the liquid above the first region.

11. The print element substrate according to claim 1, wherein the first region is a central region of the upper surface of the substrate, and the second region is a region between an outer edge of the substrate and the central region.

12. The print element substrate according to claim 1, wherein a material of the cavitation-resistant film includes tantalum.

13. The print element substrate according to claim 1, wherein the first wiring pattern is a pattern for supplying a reference voltage to the printing portion.

14. The print element substrate according to claim 1, further including a MOS transistor,
wherein the upper surface includes an interface between a gate insulating film of the MOS transistor and the substrate.

15. The print element substrate according to claim 1, wherein the angle between the side surface of the first insulating portion and the perpendicular line is larger than the angle between the side surface of the second insulating portion and the perpendicular line.

16. The print element substrate according to claim 1, further comprising a third wiring pattern,
wherein the first wiring pattern is configured to supply a first voltage to the printing portion,
wherein the third wiring pattern is configured to supply a second voltage to the printing portion,
wherein the cavitation-resistant film includes:
a first part provided over the first wiring pattern; and
a second part isolated from the first part and provided over the third wiring pattern, and
wherein the second wiring pattern is electrically isolated from the first part of the cavitation-resistant film and is connected to the second part of the cavitation-resistant film.

17. The print element substrate according to claim 1, wherein the second wiring pattern is formed of a conductive material that is the same as the conductive material included in the cavitation-resistant film.

18. The printhead according to claim 2, wherein the second wiring pattern is formed of a conductive material that is the same as the conductive material included in the cavitation-resistant film.

19. The printing apparatus according to claim 3, wherein the second wiring pattern is formed of a conductive material that is the same as the conductive material included in the cavitation-resistant film.

* * * * *